United States Patent
Miyazaki et al.

(10) Patent No.: US 9,482,904 B2
(45) Date of Patent: Nov. 1, 2016

(54) LIQUID CRYSTAL DISPLAY DEVICE AND MANUFACTURING METHOD THEREOF

(71) Applicant: Japan Display Inc., Minato-ku (JP)

(72) Inventors: Daisuke Miyazaki, Tokyo (JP); Noboru Kunimatsu, Tokyo (JP); Yojiro Shimada, Tokyo (JP); Yoshinori Yamamoto, Tokyo (JP); Toshiyuki Higano, Tokyo (JP); Ryoichi Tabuchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 1 day.

(21) Appl. No.: 14/615,657

(22) Filed: Feb. 6, 2015

(65) Prior Publication Data
US 2015/0226990 A1     Aug. 13, 2015

(30) Foreign Application Priority Data
Feb. 7, 2014 (JP) ................. 2014-022203

(51) Int. Cl.
| | | |
|---|---|---|
| *G02F 1/1339* | (2006.01) | |
| *H01L 27/12* | (2006.01) | |
| *G02F 1/1337* | (2006.01) | |

(52) U.S. Cl.
CPC ........ *G02F 1/1339* (2013.01); *G02F 1/133723* (2013.01); *H01L 27/1259* (2013.01)

(58) Field of Classification Search
CPC ...... G02F 1/13; G02F 1/1368; G02F 1/1339; G02F 1/1337; G02F 1/133723; G02F 1/133711; G02F 1/1333; G02F 1/1362; G02F 2001/133388

USPC ........ 349/123, 153, 190, 122, 187; 156/295, 156/60, 107
See application file for complete search history.

(56) References Cited

U.S. PATENT DOCUMENTS

| | | | |
|---|---|---|---|
| 2007/0091247 A1 | 4/2007 | Onda | |
| 2009/0002619 A1* | 1/2009 | Kanai | G02F 1/1341 349/129 |
| 2014/0085580 A1* | 3/2014 | Fuchikami | G02F 1/1337 349/123 |

FOREIGN PATENT DOCUMENTS

| | | |
|---|---|---|
| JP | 2003-126760 | 5/2003 |
| JP | 2007-114586 | 5/2007 |
| JP | 2009-258351 | 11/2009 |

* cited by examiner

*Primary Examiner* — Thoi Duong
(74) *Attorney, Agent, or Firm* — Oblon, McClelland, Maier & Neustadt, L.L.P.

(57) ABSTRACT

A technique for attaining both improvement of edge rectilinearity of an alignment film and reduction of unevenness is provided. A liquid crystal display device includes a first substrate on which a first alignment film is formed, a second substrate on which a second alignment film is formed, and a liquid crystal layer sandwiched between the first and second substrates. A material forming a frame arranged to surround the first alignment film inside a seal member with which the first and second substrates are bonded to each other is a highly water repellent organic material having a low solubility in an application liquid for forming the first alignment film.

19 Claims, 10 Drawing Sheets

LIQUID CRYSTAL DISPLAY DEVICE AND MANUFACTURING METHOD THEREOF

CLAIM OF PRIORITY

The present application claims priority from Japanese patent application JP 2014-22203 filed on Feb. 7, 2014, the content of which is hereby incorporated by reference into this application.

BACKGROUND OF THE INVENTION

1. Field of the Invention

The present invention relates to a liquid crystal display device and a manufacturing method thereof.

2. Description of the Related Art

In general, liquid crystal display devices are known that are used in television receivers or the like as image display devices. Demands for liquid crystal display devices have recently increased as thin image display devices having low power consumption and high image quality, and the techniques of the liquid crystal display devices have been remarkably advanced. Especially, active-matrix type color liquid crystal display devices including switching devices such as TFTs (thin film transistors) have been developed. The liquid crystal display device includes a liquid crystal display panel having an array substrate (TFT substrate) on which TFTs and the like are formed, a counter substrate (CF substrate) on which a color filter and the like are formed, and a liquid crystal layer sandwiched between the TFT substrate and the CF substrate. Each of the TFT substrate and the CF substrate has an alignment film which is in touch with the liquid crystal layer. The TFT substrate and the CF substrate are bonded to each other with a seal member. The alignment film is formed mainly by flexography. However, it is becoming difficult for this technique to satisfy the printing positional accuracy required for narrowing a bezel. Therefore, application (coating) by an ink jet technique attracts attention in place of flexography (see Japanese Unexamined Patent Application Publications Nos. 2003-126760, 2009-258351, and 2007-114586, for example).

In formation of a TFT substrate of a large-size liquid crystal display panel used for a television receiver, TFTs and the like are formed on a glass substrate, and thereafter an alignment film is formed by ink jet application in which an application liquid is ejected onto an alignment film formation region of the glass substrate.

SUMMARY OF THE INVENTION

As a method for forming an alignment film used in a liquid crystal display device that will be required to have a narrower bezel, the inventors focused on and studied ink jet application that achieves high ink drop placement accuracy. In the ink jet application, however, when an ink viscosity is low, application unevenness (coating unevenness) on an uneven substrate having a hole or the like can be reduced because the ink can easily flow, but edge rectilinearity is bad. To the contrary, when an ink viscosity is high, edge rectilinearity is good because the ink does not flow. However, application unevenness increases on an uneven substrate having a hole or the like. That is, improvement of edge rectilinearity and reduction of application unevenness are not attained at the same time. Therefore, the inventors studied optimization of the ink viscosity, an ink dropping method, and the like, and found a condition range in which both edge rectilinearity and application unevenness can be improved to some extent by making an ink droplet finer and narrowing a dropping pitch. However, this does not eliminate inconsistence between improvement of edge rectilinearity and reduction of application unevenness radically and therefore this was determined to be insufficient for satisfying the accuracy that will be required in the future.

It is an object of the present invention to provide a technique for attaining both improvement of edge rectilinearity of an alignment film and reduction of unevenness of the alignment film.

In order to achieve the above object, according to an embodiment of the present invention, a liquid crystal display device includes: a first substrate on which a thin film transistor and a first alignment film are formed; a second substrate, opposed to the first substrate, on which a second alignment film is formed; and a liquid crystal layer sandwiched between the first substrate and the second substrate. The first substrate and the second substrate are bonded to each other with a seal member. A frame is arranged inside the seal member around the first alignment film to surround the first alignment film, and a material forming the frame is a highly water repellent organic material having a low solubility in an application liquid for forming the first alignment film.

According to another embodiment of the present invention, a liquid crystal display device includes: a first substrate having a display region on which a first alignment film is formed; a second substrate, opposed to the first substrate, on which a second alignment film is formed; and a liquid crystal layer sandwiched between the first substrate and the second substrate. The first substrate and the second substrate are bonded to each other with a seal member. A driving circuit portion is provided on the first substrate, and a frame is arranged between the driving circuit portion and the display region. The first alignment film is arranged to extend from the frame to the display region. A material forming the frame is a highly water repellent organic material having a low solubility in an application liquid for forming the first alignment film.

According to a still another embodiment of the present invention, a manufacturing method of a liquid crystal display device includes: a first step of preparing a first substrate on which thin film transistors are formed; a second step of forming a frame on the first substrate by ink jet application; a third step of applying an application liquid for forming a first alignment film on one of two regions sectioned by the frame by ink jet application; a fourth step of applying the application liquid for forming the first alignment film to form the first alignment film; a fifth step of preparing a second substrate on which a second alignment film is formed; and a sixth step of arranging a liquid crystal layer between the first substrate and the second substrate that are arranged such that the first alignment film and the second alignment film are opposed to each other, in a region surrounded by a seal member. A material forming the frame is a highly water repellent organic material having a low solubility in the application liquid for forming the first alignment film.

DETAILED DESCRIPTION OF THE INVENTION

First, an idea of embodiments of the present invention is described.

An ink jet method can be employed for forming an alignment film of a liquid crystal display panel. In a case of employing the ink jet method, it is enough that an application liquid is applied onto a desired region only, and therefore the usage of the application liquid can be reduced to minimum and the manufacturing cost can be reduced. Thus, the ink jet method is excellent in productivity.

The use of the ink jet method enables formation of the alignment film with an accuracy required for a large-size liquid crystal display panel. This is because, in a case of the large-size liquid crystal display panel, (1) an alignment film having a uniform thickness can be formed by using an application liquid having a commonly used viscosity without necessity of increasing a ratio of solvent in the application liquid, (2) an excellent display quality can be obtained without ensuring the linearity of the peripheral edge of the alignment film, and (3) a problem of deterioration of the display quality because of an effect of a halo region of the alignment film does not occur. The halo region referred to herein is a region in which the thickness of the peripheral edge of the alignment film is uneven.

In general, a pixel pitch in the large-size liquid crystal display panel is large, and a surface on which the alignment film is to be formed is relatively flat. Without setting the viscosity of the application liquid to a lower level than a commonly used level, the application liquid ejected onto the surface on which the alignment film is to be formed can spread out well. Therefore, as described in above (1), the alignment film having a uniform thickness can be formed.

Moreover, in general, the large-size liquid crystal display panel has an enough area and allows a bezel region to be ensured. Please note that the bezel region is a region that is outside a display region and a peripheral portion of the liquid crystal display panel. Even in a case where the alignment film is formed by the ink jet method that ejects the application liquid having a commonly used viscosity, it is difficult to ensure the linearity of the peripheral edge of the alignment film. Therefore, the peripheral edge of the alignment film may form a zigzag shape, for example, so that it may reach the outside of the expected region in which the alignment film is to be formed. However, because the bezel region is enough, a region in which a seal member is to be formed is also enough and therefore the seal member can be provided in a region where sufficient adhesion between the seal member and an underlayer of the alignment film can be ensured. Thus, lowering of the adhesive strength of the seal member between the substrates can be eliminated. In a case where the alignment film is formed outside the region in which the seal member is formed, that is, in a case where the seal member is formed in the alignment film formation region, the adhering force between the substrates may be lowered and moisture may enter to the inside the liquid crystal panel via the alignment film when the alignment film is formed of some materials or have some characteristics. The moisture that has entered to the inside of the liquid crystal display panel lowers the display quality.

Moreover, because the large-size liquid crystal display panel has an enough bezel region, it is possible to form the alignment film such that the halo region is arranged outside the display region. Therefore, the problem of deterioration of the display quality caused by the effect of the halo region of the alignment film, as described in above (3), hardly occurs.

However, by the above method, it is difficult to form the alignment film with an accuracy required for a small-size liquid crystal display panel such as that for a mobile terminal (e.g., a smartphone). This is because in the small-size liquid crystal display panel the following problems (4) to (6) may arise.

(4) In general, a pixel pitch of a small-size liquid crystal display panel is small and a surface on which an alignment film is to be formed is uneven. This is because the surface on which the alignment film is to be formed in a region corresponding to a TFT or the like is raised, while that surface is recessed in a through hole region. It is more difficult for an application liquid to spread out on an uneven surface than on the flat surface. Therefore, when the application liquid used for the large-size liquid crystal display panel (the application liquid having a commonly used viscosity) is ejected by the ink jet method, the application liquid does not spread sufficiently, so that the thickness of the alignment film is not uniform or a portion of the application liquid is not applied to cause a portion where no alignment film is formed. From the above, there is a problem that it is difficult to form the alignment film having a uniform thickness when the application liquid having a commonly used viscosity is used.

(5) In general, it is difficult to ensure a bezel region having an enough area in a small-size liquid crystal display panel. As described above, in a case where an alignment film is formed by an ink jet method in which an application liquid is ejected, it is difficult to ensure the linearity of the peripheral edge of the alignment film, so that the peripheral edge of the alignment film may reach the outside of an expected alignment film formation region. However, because the bezel region is not enough, a region in which a seal member is to be formed is not enough either and therefore it may be difficult to ensure a sufficient level of adhesion strength between the seal member and the underlayer of the alignment film. Thus, not only the possibility of lowering of the adhering strength between the substrates increases but also the possibility of entrance of moisture to the inside of the liquid crystal display panel through the alignment film or by flowing on an interface of the alignment film for some materials of the alignment film, for example, also increases. From the above, there arises a problem that an excellent display quality can be hardly obtained unless the linearity of the peripheral edge of the alignment film is ensured.

(6) Because the bezel region is not enough, it is difficult to form the alignment film so that the halo region is located outside the display region. The alignment film may be formed so that the halo region is arranged in the display region. In the halo region, there is a problem that the display quality is deteriorated because alignment of liquid crystal molecules by the alignment film is insufficient, or because a gap with the liquid crystal layer is reduced, for example.

The above (4) and (5) cannot be solved at the same time. That is, because an application liquid having a lower viscosity can spread out more easily, the alignment film having a uniform thickness can be formed more easily whereas the linearity of the peripheral edge of the alignment film is difficult to ensure. On the other hand, because it is more difficult for an application liquid having a higher viscosity to spread out, formation of an alignment film having a uniform thickness is more difficult. However, the linearity of the peripheral edge of the alignment film can be easily ensured.

As found from the above description, it is difficult to form the alignment film with an accuracy required for the small-size liquid crystal display panel by the above-described method for forming the alignment film.

Therefore, in embodiments of the present invention, a manufacturing method of a liquid crystal display panel, which can achieve a narrower bezel and can provide a high product yield and an excellent display quality, can be obtained by finding the factor of this problem and solving this problem. Next, for solving the problem of the embodiments of the present invention, a means for embodying the above idea is described. Although the difference between the small-size liquid crystal display panel and the large-size display panel is described in the above description, a demand for narrowing the bezel region may increase also for the large-size liquid crystal display panel in the future. In that case, the present invention can be also applied to the large-size panel. It should be noted that the present invention does not exclude the large-size liquid crystal display panel.

The respective embodiments of the present invention are described below, referring to the drawings.

Please note that the disclosure is a mere example and modifications that a person skilled in the art could easily conceive as appropriate while the summary of the invention is kept should be naturally included in the scope of the present invention. Moreover, drawings may show the width, thickness, shape, and the like of each portion more schematically as compared with those in an actual form for the purpose of more clarifying the description. However, those are mere examples and are not intended to limit the interpretation of the present invention.

In addition, in the specification and the respective drawings of the present application, the same elements as those already described as to the drawing already referred to are labeled with the same reference signs and the description thereof is omitted as appropriate.

First Embodiment

A liquid crystal display device and a manufacturing method thereof according to a first embodiment of the present invention are described in detail by using the drawings.

Figure 5:
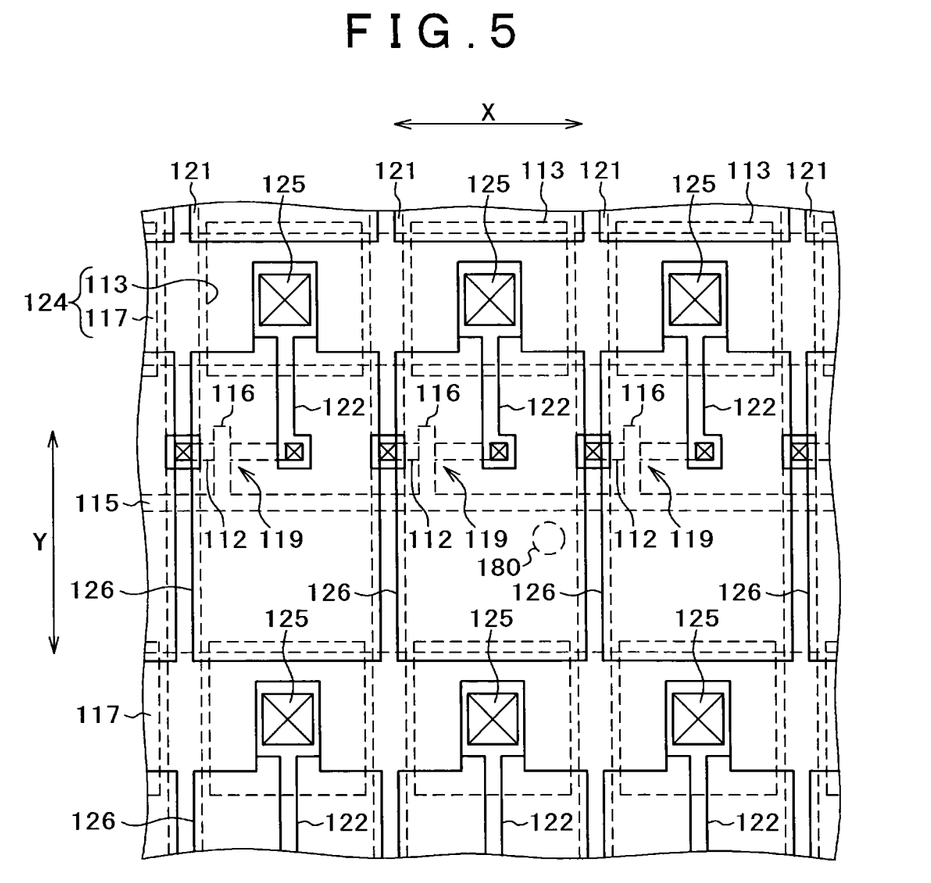
FIG. 5 is an enlarged plan view of the TFT substrate, showing a wiring structure thereof.
Figure 6:
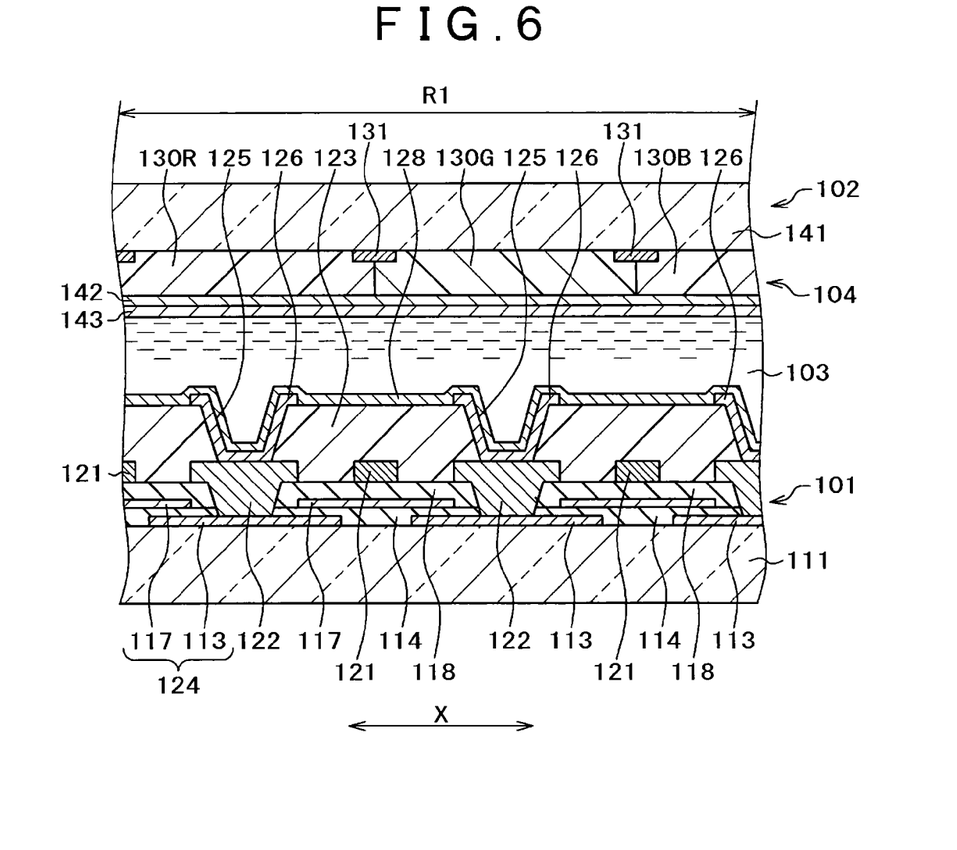
FIG. 6 is an enlarged cross-sectional view of the liquid crystal display panel, showing the structure thereof.

First, the structure of a liquid crystal display panel in the liquid crystal display device is described. As shown in FIGS. 1 to 6, the liquid crystal display panel includes a TFT substrate (array substrate) 101, a counter substrate (CF substrate) 102 arranged to be opposed to the TFT substrate with a predetermined gap therebetween, a liquid crystal layer 103 sandwiched between those substrates, and a color filter 104 (FIG. 6). On an outer surface of each of the TFT substrate 101 and the counter substrate 102, a polarization plate is arranged. Also, on the outer surface side of the TFT substrate 101, a backlight unit is arranged. In this manner, the liquid crystal display device is configured. The TFT substrate 101 and the counter substrate 102 have a rectangular display region R1 (FIG. 3). The color filter 104 is provided on the counter substrate 102, but may be provided on the TFT substrate 101. The display region R1 may have another shape than the rectangular shape.

The TFT substrate 101 includes a glass substrate 111 as a transparent insulating substrate (FIG. 6). In the display region R1, a plurality of scanning lines 115 and a plurality of signal lines 121 are arranged in a lattice configuration. The scanning lines 115 extend in a row direction X and are arranged at intervals in a column direction Y crossing the row direction X at right angles. The signal lines 121 extend in the column direction Y to cross the scanning lines 115 and are arranged at intervals in the row direction X (FIG. 5).

On the glass substrate 111, a plurality of auxiliary capacitance lines 117 are formed which constitute auxiliary capacitors 124, extend in the row direction X to cross the signal lines 121, and are arranged at intervals in the column direction Y. The auxiliary capacitance lines 117 extend parallel to the scanning lines 115 (FIG. 5).

Figure 4:
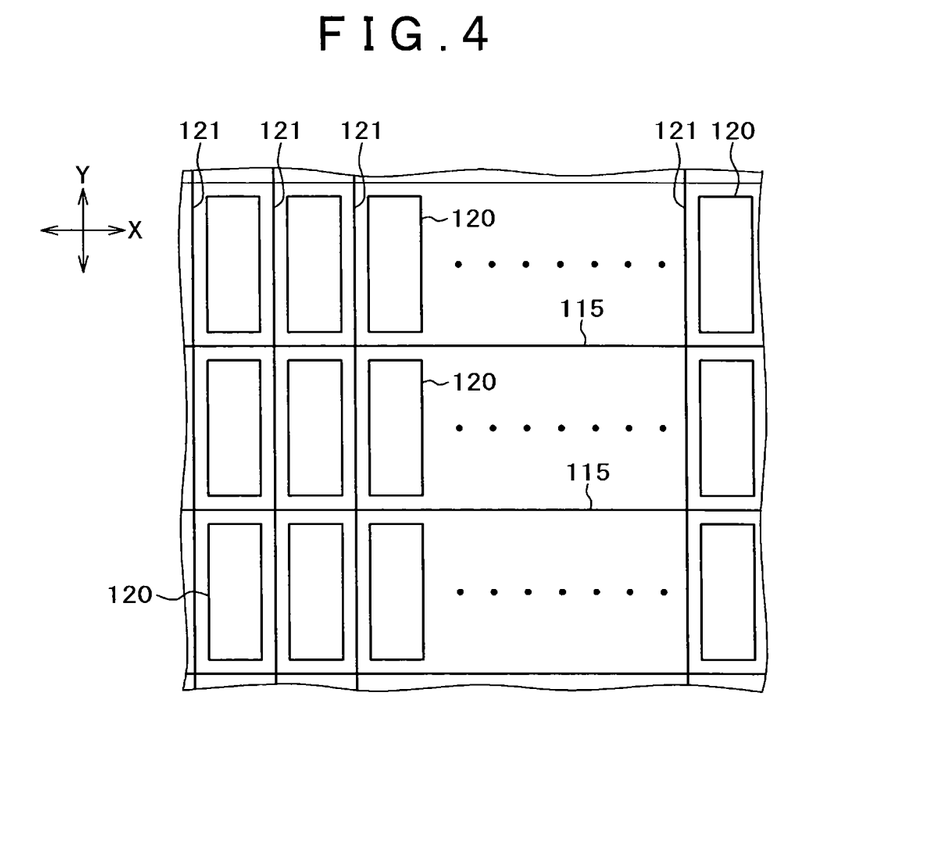
FIG. 4 is a schematic plan view of a portion of a TFT substrate shown in FIGS. 1 to 3.

The TFT substrate 101 and the counter substrate 102 have a plurality of pixels 120 arranged in a matrix defined by the signal lines 121 and the scanning lines 115 (FIG. 4). That is, each pixel 120 is a region surrounded by adjacent two signal lines 121 and adjacent two scanning lines 115. In each pixel 120 of the TFT substrate 101, a TFT (thin film transistor) 119 as a switching device is provided (FIG. 5). More specifically, the TFT 119 is provided near each of intersections of the scanning lines 115 and the signal lines 121 (FIG. 5).

The TFT 119 has a semiconductor layer 112 formed of amorphous silicon (a-Si) or polysilicon (p-Si) as semiconductor, and a gate electrode 116 formed by an extension of the scanning line 115. In this embodiment, the semiconductor layer 112 and an auxiliary capacitance electrode 113 described later are formed of p-Si (FIG. 5).

In the display region R1, the semiconductor layer 112 and the auxiliary capacitance electrode 113 are formed on the glass substrate 111, and a gate insulation film 119 is formed on the glass substrate including the semiconductor layer and the auxiliary capacitance electrode. On the gate insulation film 114, the scanning line 115, the gate electrode 116, and the auxiliary capacitance line 117 are formed. The auxiliary capacitance line 117 and the auxiliary capacitance electrode 113 are arranged to be opposed to each other with the gate insulation film 114 arranged therebetween. On the gate insulation film 114, an interlayer insulation film 118 is formed to be also located on the scanning line 115, the gate electrode 116, and the auxiliary capacitance line 117. In this embodiment, the interlayer insulation film 118 is an inorganic insulation film (FIGS. 5 and 6).

On the interlayer insulation film 118, the signal lines 121 and contact electrodes 122 are formed (FIG. 6). Each contact electrode 122 is connected to a drain region of the semiconductor layer 112 via a contact hole formed through the gate insulation film 114 and the interlayer insulation film 118 and to a pixel electrode 126 described later. Moreover, the contact electrode 122 is connected to the auxiliary capacitance electrode 113 via another contact hole formed through the gate insulation film 114 and the interlayer insulation film 118. The auxiliary capacitance line 117 is formed except for a connection between the auxiliary capacitance electrode 113 and the contact electrode 122.

The signal line 121 is connected to a source region of the semiconductor layer 112 via a contact hole formed through the gate insulation film 114 and the interlayer insulation film 118. A protective insulation film 123 is formed over the interlayer insulation film 118, the signal lines 121, and the contact electrodes 122. The protective insulation film 123 also acts as a flattening film for flattening unevenness generated by wirings on the substrate and the like. In this embodiment, the protective insulation film 123 is an organic insulation film. The protective insulation film 123 covers not only the display region R1 but also a bezel region R2 that has a rectangular frame configuration surrounding the display region R1. The thickness of the protective insulation film 123 is 2.5 μm, for example.

Pixel electrodes 126 are formed by transparent conductive films such as ITO (Indium tin oxide) on the protective insulation film 123 (FIG. 6). In the protective insulation film 123 over the contact electrodes 122, a plurality of contact holes 125 are formed. These contact holes 125 are provided in the pixels 120, respectively.

Each pixel electrode 126 is connected to the contact electrode 122 through the contact hole 125. A peripheral portion of each pixel electrode 126 is superimposed on the auxiliary capacitance line 117 and the signal lines 121. The pixel electrodes 126 form the pixels 120, respectively.

Figure 1:
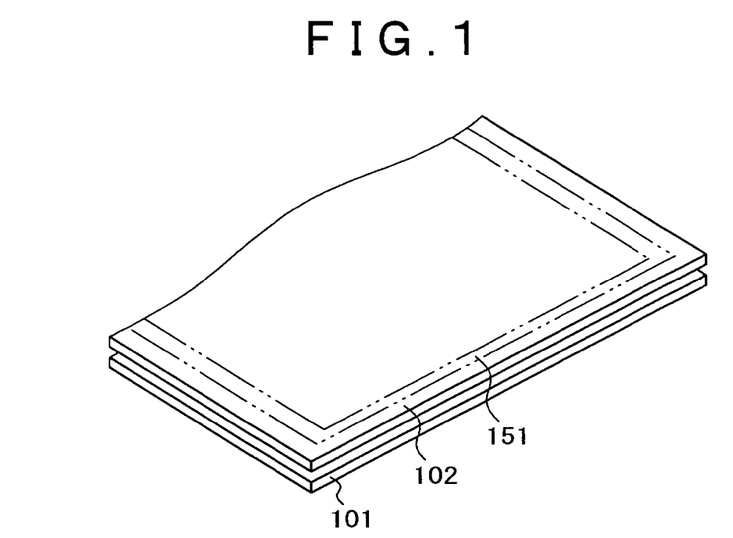
FIG. 1 is a perspective view of a liquid crystal display panel according to a first embodiment of the present invention.
Figure 2:
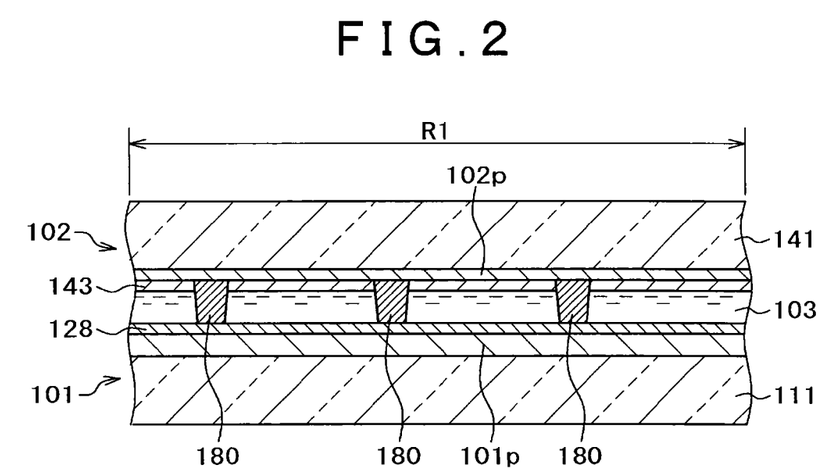
FIG. 2 is a schematic cross-sectional view of the liquid crystal display panel.
Figure 3:
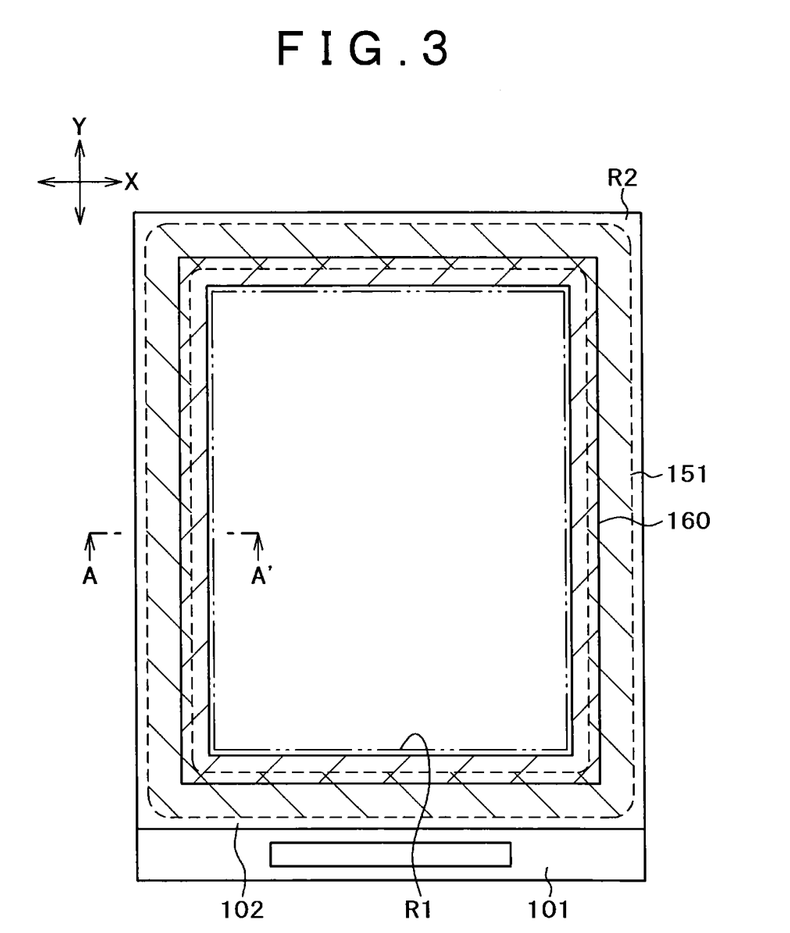
FIG. 3 is a schematic plan view of the liquid crystal display panel, showing a wiring structure.

As described above, an array pattern 101p is formed on the glass substrate 111 (FIG. 2). In the display region R1, the array pattern 101p is a layered structure between the glass substrate 111 and the pixel electrode 126.

On the array pattern 101p (the pixel electrodes 126, the protective insulation film 123 and the like), an alignment film 128 is formed (FIG. 6). The alignment film 128 is formed within an alignment film formation region. The peripheral edge of the alignment film 128 is in contact with a frame (bank portion) 160. Therefore, the shape of the peripheral edge of the alignment film 128 is regulated by the frame 160. The alignment film 128 is formed of polyimide that is an organic material. The thickness of the alignment film 128 is 0.1 μm, for example.

Figure 7:
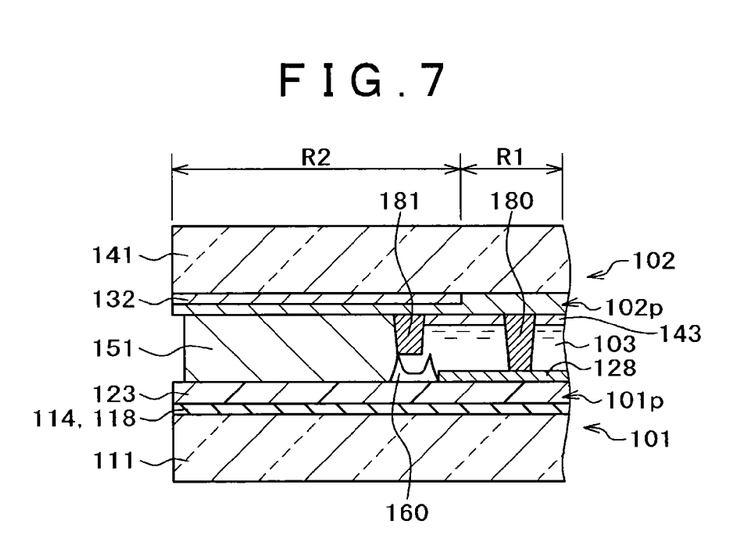
FIG. 7 is an enlarged cross-sectional view of the liquid crystal display panel, taken along line A-A' in FIG. 3, schematically showing an example of a peripheral portion thereof.

On the other hand, in the bezel region R2, the frame (bank portion) 160 is formed on the glass substrate 111, as shown in FIGS. 3 and 7. In the bezel region R2, the array pattern 101p has the gate insulation film 114, the interlayer insulation film 118, and the protective insulation film 123, and further has at least a driving circuit, various types of wirings and the like that are covered by the protective insulation film 123.

The frame 160 is formed on the protective insulation film 123 over the entire area of the outer surrounding portion of the alignment film formation region. The frame 160 is located in the bezel region R2. The frame 160 is continuously formed in a frame configuration (in a rectangular frame configuration surrounding the display region R1) without being disconnected. Therefore, the frame 160 can be also referred to as a projection of a rectangular wall. In this embodiment, the width of the frame 160 is 200 μm, for example. However, the width can be set in a range from 50 μm to 300 μm. When the width of the frame 160 is less than 50 μm, ink for the frame (bank portion) may be interrupted during ink jet application, causing difficulty of surely damming an application liquid for an alignment film in some cases. Moreover, when the width of the frame 160 exceeds 300 μm, the linearity of the frame may be deteriorated and may hinder narrowing of the width of the bezel. The height of the frame is 0.5 μm, but can be set in a range from 0.3 μm to 1.0 μm. Since the film thickness immediately after the application liquid for the alignment film is applied is about 4 to 5 μm, it is difficult to dam the application liquid for the alignment film when the height of the frame is lower than 0.3 μm. Moreover, the height of the frame is preferably 1.0 μm or lower, when the distance (cell gap) between the TFT substrate and the counter substrate is considered. As the material for forming the frame 160, a highly water repellent organic material having a low solubility in the solvent of the application liquid for forming the alignment film 128 is suitable. Only the low solubility is not enough for damming spreading of the application liquid for the alignment film. Also, in a case where a material having only high water repellence is used for forming the frame 160, the material may come in contact with the application liquid for the alignment film at some levels of the water repellence and enter into the application liquid for the alignment film to cause burn-in or unevenness, or may cause a gap between the frame 160 and the application liquid for the alignment film. By arranging the frame, it is possible to suppress spreading of the alignment film 128 toward the peripheral edge and form the alignment film 128 so that the peripheral edge of the alignment film 128 does not reach the outside of the alignment film formation region. Although the frame is described as being continuous without being disconnected, the frame may have a configuration in which the frame is cut at a corner of the rectangular configuration, for example.

Figure 8:
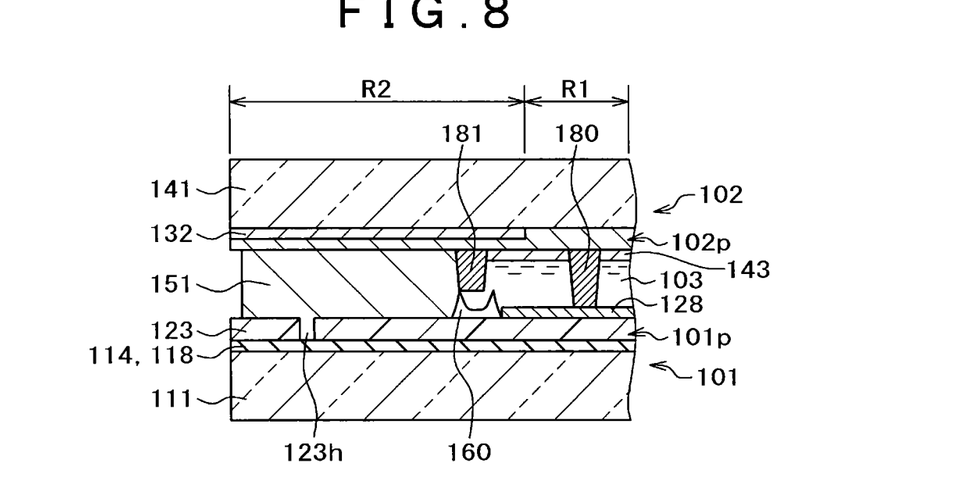
FIG. 8 is an enlarged cross-sectional view of the liquid crystal display panel, taken along line A-A' in FIG. 3, schematically showing another example of a peripheral portion thereof.

In the bezel region R2, the protective insulation film 123 may have a slit 123h, as shown in FIG. 8. The slit 123h is formed to extend through the protective insulation film so that the interlayer insulation film 118 is exposed. The slit 123h is formed in a frame configuration, and is formed in a continuous rectangular frame configuration in this example. The slit 123h has a width of several micrometers to several tens of micrometers. The slit 123h is not limited to the one that exposes the interlayer insulation film 118, but may be formed to expose the glass substrate 111 or the like.

The seal member 151 is formed so that the slit 123h is also filled with the seal member 151. The seal member 151 can prevent entrance of moisture, which passes in the protective insulation film 123 or on the surface (interface) of the protective insulation film 123, to the inside of the liquid crystal display panel, because of its property of blocking moisture.

Next, the structure of the counter substrate is described. As shown in FIGS. 1, 2, 3, 6, and 7, the counter substrate 102 has a glass substrate 141 as a transparent insulating substrate (FIG. 6). On the glass substrate 141 (on the TFT substrate side corresponding the lower side in FIG. 6), the color filter 104 is provided. The color filter 104 has a red colored layer 130R, a green colored layer 130G, and a blue colored layer 130B (FIG. 6), for example.

A light-shielding portion 131 is formed in a lattice configuration. The light-shielding portion 131 is formed to be opposed to the scanning lines 115, the auxiliary capacitor lines 117, and the signal lines 121. A peripheral light-shielding portion 132 is formed in a rectangular frame configuration and is arranged in the entire bezel region R2. The peripheral light-shielding portion 132 contributes to shielding of light leaking from the outer side of the display region R1.

The colored layers 130R, 130G, and 130B are formed on the glass substrate 141 and the light-shielding portion 131 (on the TFT substrate side). The colored layers 130R, 130G, and 130B are arranged as strips extending in the column direction Y. The colored layers 130R, 130G, and 130B are adjacent to each other in the row direction X and are alternately arranged. The peripheral portions of the colored layers 130R, 130G, and 130B overlap the light-shielding portion 131.

An overcoat layer may be arranged on the color filter 104. This can reduce the effects of unevenness of the surfaces of the light-shielding portion 131 and the color filter 104.

On the color filter 104 (or the overcoat layer) (on the TFT substrate side), a counter electrode 142 is formed by a transparent conductive film such as ITO. As described above, a counter pattern 102p is formed on the glass substrate 141 (on the TFT substrate side). The counter pattern 102p has the color filter 104 and the counter electrode 142 (FIGS. 6 and 7). The counter pattern 102p may further include an overcoat layer.

On the counter pattern 102p, a plurality of columnar spacers 180 as spacers and an alignment film 143 are formed (FIG. 7). The columnar spacers 180 are arranged in at least the display region R1. The height of the columnar spacers 180 can be made to correspond to the cell gap, and can be set to 3 to 5 µm, for example.

The alignment film 143 is arranged within the alignment film formation region. The peripheral edge of the alignment film 143 is in touch with a frame 181 (FIG. 7). Therefore, the shape of the peripheral edge of the alignment film 143 is regulated by the frame 181. The alignment film 143 is formed of polyimide that is an organic material. The thickness of the alignment film 143 is 0.1 µm, for example. The alignment film 143 on the counter substrate 102 side may be formed of the same material as the alignment film 128 on the TFT substrate 101 side, or may be different from the alignment film 128.

The frame 181 is arranged over the entire outer peripheral portion of the alignment film formation region on the glass substrate 141. The frame 181 is located in the bezel region R2. The frame 181 is continuously formed in a frame configuration (a rectangular frame configuration) without being disconnected. In this embodiment, the width of the frame 181 is 200 µm, for example. The frame 181 is formed of polyimide that is an organic material. The height of the frame 181 is 1.7 µm, for example.

By forming the frame 181, spreading of the alignment film 143 toward the peripheral edge of the counter substrate 102 can be suppressed, and the alignment film 143 can be formed so that the peripheral edge of the alignment film 143 does not reach the outside of the alignment film formation region. Moreover, because of the linearity of the frame 181, the frame 181 can suppress formation of the zigzag shape of the peripheral edge of the alignment film 143. That is, the frame 181 can ensure the linearity of the peripheral edge of the alignment film 143.

As shown in FIGS. 1 to 3 and 7, the TFT substrate 101 and the counter substrate 102 are arranged to be opposed to each other with a predetermined gap therebetween provided by a plurality of columnar spacers 180 (FIG. 2). The seal member 151 is provided between the TFT substrate 101 and the counter substrate 102 in the bezel region R2 so that the seal member 151 is formed continuously in a rectangular frame configuration (FIG. 3).

The TFT substrate 101 and the counter substrate 102 are joined (bonded) to each other with the seal member 151. The seal member 151 has a water blocking property. The seal member 151 can be formed by using a resin such as acryl. The outer edge of the seal member 151 is located on the side of the frame 160, 181 that is closer to the outer edge of the substrate (the TFT substrate 101 and the CF substrate 102) (FIG. 7). Therefore, entrance of moisture flowing on the frame 160, 181 or the surface (interface) of the alignment film 128, 143, toward the display region R1 can be blocked. It should be noted that, even if the seal member 151 is formed on the display region R1 side of the frame 160, 181, there is no problem as long as the seal member 151 has no effect on the display region R1.

The liquid crystal layer 103 is enclosed in a space surrounded by the TFT substrate 101, the counter substrate 102, and the seal member 151.

Figure 9:
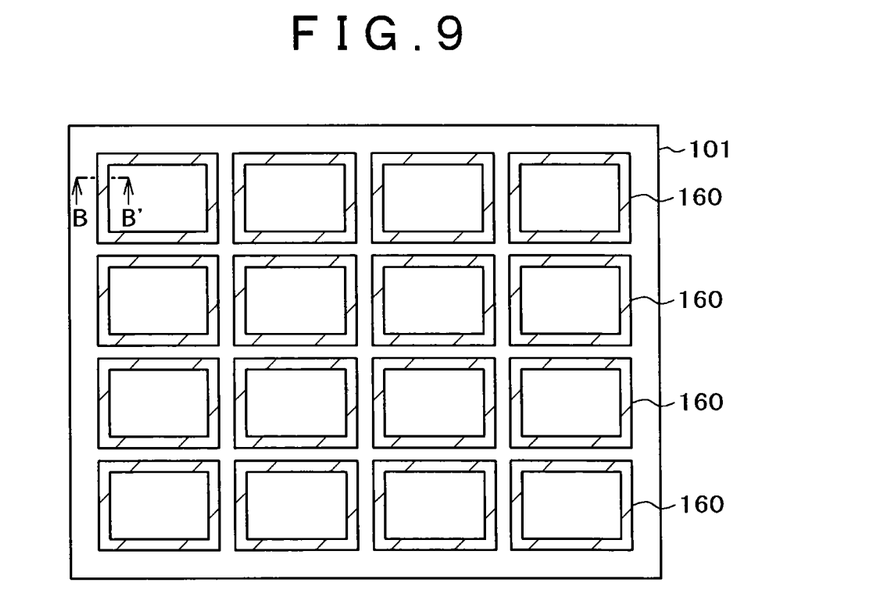
FIG. 9 is a schematic plan view for explaining an alignment film formation step (formation of a frame of an alignment film formation region) in a manufacturing method of a liquid crystal display device according to the first embodiment of the present invention.
Figure 10:
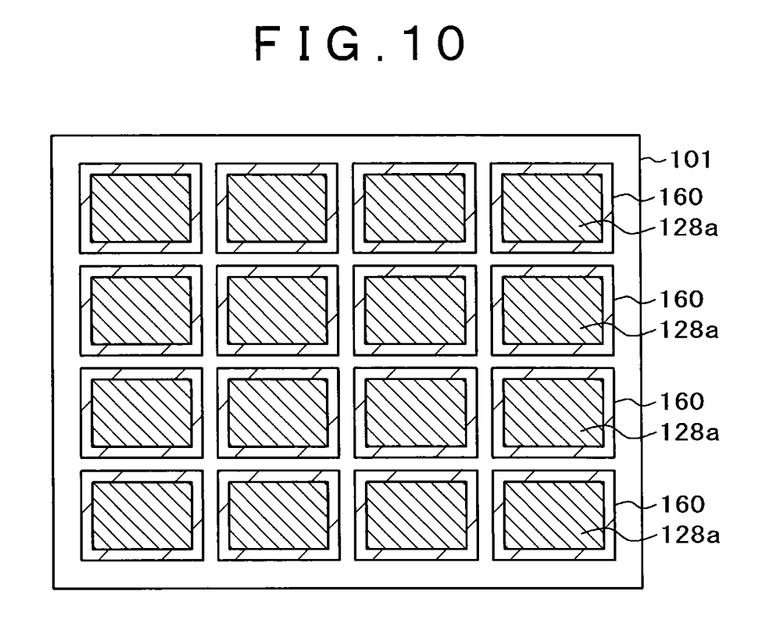
FIG. 10 is a schematic plan view for explaining the alignment film formation step (application of an application liquid for forming the alignment film in the alignment film formation region) in the manufacturing method of the liquid crystal display device according to the first embodiment of the present invention.
Figure 11A:
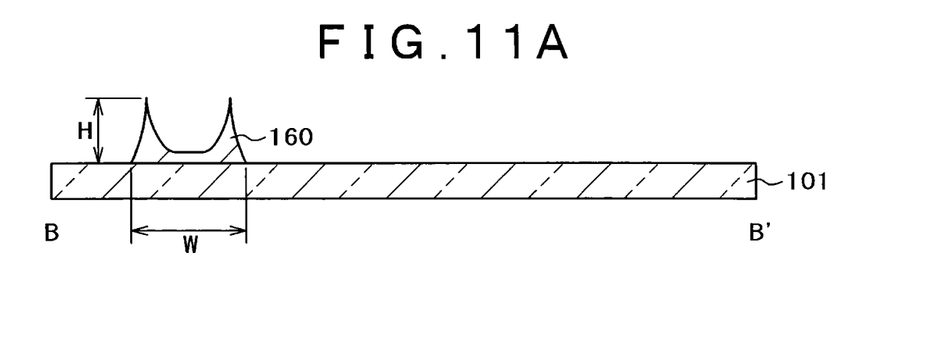
FIG. 11A is a schematic cross-sectional view taken along line B-B' in FIG. 9, for explaining the alignment film formation step (formation of a frame of the alignment film formation region) in the manufacturing method of the liquid crystal display device according to the first embodiment of the present invention.

Next, a procedure for forming the alignment film 128 on the protective insulation film 123 of the TFT substrate is described using FIGS. 9, 10, and 11A to 11C. First, the TFT substrate 101 is prepared that has a plurality of liquid crystal display panel regions (4×4 regions in this example) in which the protective insulation film 123 is formed, and the frame 160 for defining the alignment film formation region is formed in each of the liquid crystal display panel regions (FIG. 9). More specifically, a liquid containing a highly water repellent organic material having a low solubility in a solvent of an alignment film application liquid is applied onto a predetermined region of the heated TFT substrate 101 by ink jet application. Since the TFT substrate 101 is heated, that liquid thus applied is immediately dried when being applied onto the predetermined region on the protective insulation film of the TFT substrate, so that a frame that has projections on both ends by coffee-stain phenomenon as shown in FIG. 11A (schematic cross-sectional view taken along line B-B' in FIG. 9) and has a height H of 0.5 μm and a width W of 200 μm is formed. The viscosity of the alignment film application liquid for the TFT substrate may be adjusted to be lower than the viscosity of the alignment film application liquid for the counter substrate, since the surface of the TFT substrate on which the alignment film is to be formed is more uneven than the surface of the counter substrate on which the alignment film is to be formed. By using an ink containing a highly water repellent organic material having a low solubility as the material for forming the frame, the alignment film application liquid can be dammed effectively. In a case where the alignment film application liquid is a GBL (γ-butyrolactone) rich solvent, polymer, that is poorly soluble in GBL and has a water-repellent side chain added thereto, can be used as the frame (bank portion). Please note that heating may not be necessary for some organic materials used for forming the frame.

Figure 11B:
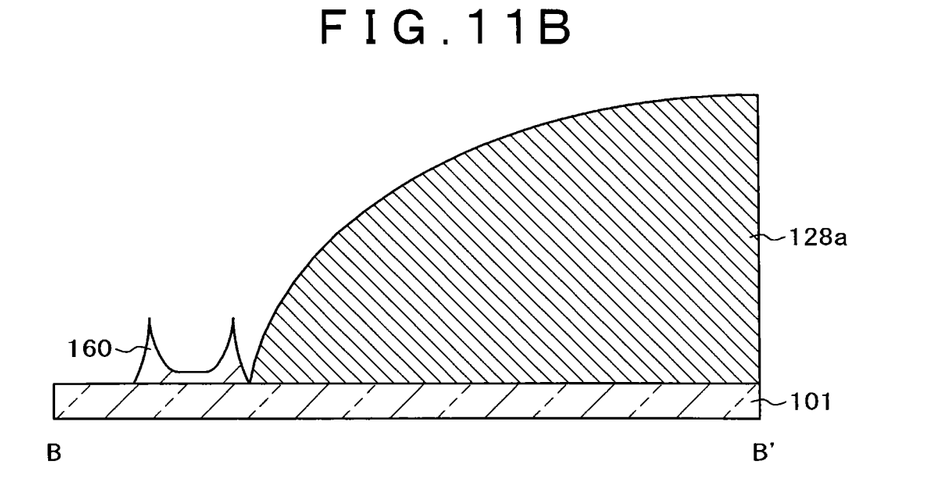
FIG. 11B is a schematic cross-sectional view of the same region shown in FIG. 11A, for explaining the alignment film formation step (application of the application liquid for forming the alignment film in the alignment film formation region) in the manufacturing method of the liquid crystal display device according to the first embodiment of the present invention.
Figure 11C:
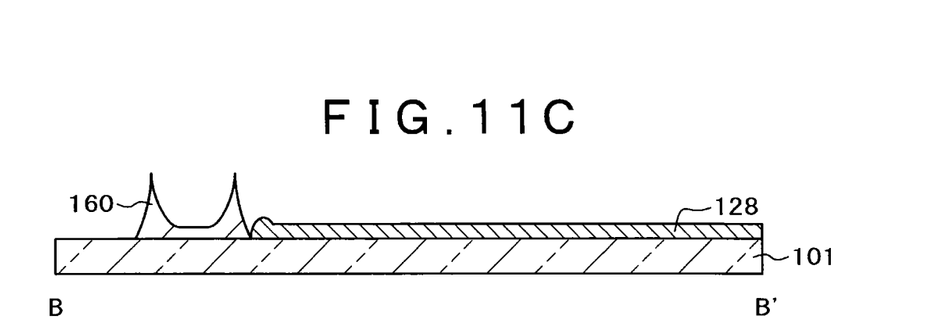
FIG. 11C is a schematic cross-sectional view of the same region shown in FIG. 11A, for explaining the alignment film formation step (formation of the alignment film in the alignment film formation region) in the manufacturing method of the liquid crystal display device according to the first embodiment of the present invention.

After formation of the frame 160, the alignment film application liquid containing polyimide is applied by ink jet application onto the alignment film formation region surrounded by the frame 160 on the TFT substrate at a room temperature, as shown in FIG. 10, to have a thickness of 4 to 5 μm. The cross-sectional view at this state is shown in FIG. 11B (the shown region is the same as that shown in FIG. 11A). The alignment application liquid (i.e., application liquid for forming the alignment film) 128a is dammed by the frame 160. Then, the TFT substrate is heated, thereby the alignment film having a thickness of about 0.1 μm is formed (FIG. 11O). The temperature of the TFT substrate at the formation of the alignment film is desirably lower than that at the formation of the frame, considering the uniformity of the thickness of the alignment film.

The alignment film on the counter substrate side can be also formed in the same manner as the above-described procedure. The frame 181 formed on the counter substrate side can be formed simultaneously with the columnar spacers 180 by using a predetermined photomask when the columnar spacers 180 are formed, for example. In this case, the frame 181 can be formed without increasing the manufacturing step. Moreover, when a half tone mask is used as the above-described photomask, the frame 181 that is lower in height than the columnar spacers 180 can be formed. Thus, it is possible to contribute to uniformizing the cell gap.

After the alignment film is formed and an alignment process such as rubbing or irradiation with light, e.g., ultraviolet rays, is performed for the alignment film, the TFT substrate and the counter substrate are bonded to each other. More specifically, the seal member is provided on either one of the TFT substrate 101 and the counter substrate 102. In this example, the seal member is provided over the entire circumference of the bezel region R2 of the TFT substrate 101. As the seal member, an organic material such as ultraviolet curing acrylic resin can be used. In this manner, the seal is formed in a frame configuration.

Then, a liquid crystal material is dropped onto a region surrounded by the seal member. Subsequently, the TFT substrate 101 and the counter substrate 102 are arranged to be opposed so that the alignment film 128 and the alignment film 143 are opposed to each other, and the peripheral portion of the TFT substrate 101 and the peripheral portion of the counter substrate 102 are bonded to each other with the seal member while a predetermined gap is kept between the TFT substrate 101 and the counter substrate 102 by a plurality of columnar spacers 180.

Subsequently, the seal member is irradiated with ultraviolet rays from the outside to be cured, and is thereafter subjected to a thermosetting process to be fully cured. In this manner, the TFT substrate 101 and the counter substrate 102 are joined to each other via the seal 151.

Then, a multilayer substrate of the TFT substrate 101 and the counter substrate 102 jointed to each other is divided. Thus, 16 liquid crystal display panels shown in FIG. 3 are completed.

Figure 13:
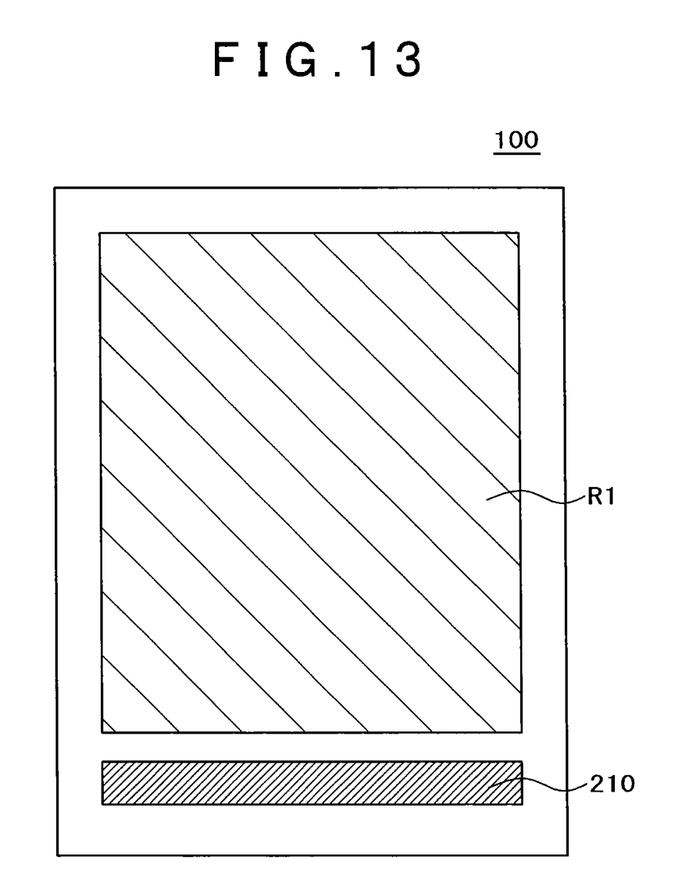
FIG. 13 is a schematic plan view of an exemplary liquid crystal display device according to the first embodiment of the present invention.

A backlight and the like are assembled with the thus obtained liquid crystal display panel, thereby a liquid crystal display device is completed. An example of the liquid crystal display device 100 is shown in FIG. 13. A reference numeral 210 denotes a driving circuit portion. By using this method, the liquid crystal display device could be manufactured with a high yield even in a case where the bezel thereof was narrow. Moreover, when evaluation of this liquid crystal display device was performed, burn-in and unevenness were reduced even if the bezel was narrow, and a high quality image could be obtained. Please note that in the driving circuit portion 210 a terminal formed on the TFT substrate and a driving circuit formed by a semiconductor chip and the like are connected to each other via an anisotropic conductive sheet. The driving circuit portion is not necessarily provided at one portion in the liquid crystal display panel, but may be provided at a plurality of portions.

The above-described method enables the alignment film 128 (143) to be formed with an accuracy required for a small-size liquid crystal display panel such as that for mobile terminal (e.g., smartphone) use. This is because the aforementioned problems (4) to (6) can be solved.

In other words, because the alignment film application liquid 128a having a lower viscosity than an application liquid having a commonly used viscosity, the aforementioned problem (4) can be solved. This is because the frame 160 formed by using ink containing a highly water repellent organic material that has a low solubility can dam the alignment film application liquid 128a. By setting the viscosity of the alignment film application liquid 128a to be low, the alignment film application liquid 128a can spread well even if the surface on which the alignment film is to be formed is uneven, and the alignment film 128 having a uniform thickness can be formed.

Moreover, because the linearity of the peripheral edges of the alignment film 128, 143 can be ensured, the aforementioned problem (5) can be solved. This is because the shapes of the peripheral edges of the alignment films 128 and 143 are regulated by the frames 160 and 181, respectively. The alignment films 128 and 143 are formed so that the peripheral edges thereof do not reach the outside of the alignment film formation region.

Therefore, in a case where the bezel region (the region in which the seal member 151 is to be formed) does not have an enough area, it is possible to provide the seal member so that the alignment film 128, 143 and the frame 160, 181 are not exposed to an outside air. Thus, entrance of moisture flowing in the alignment film 128, 143 and the frame 160, 181 or on the interface of the alignment film 128, 143 and the frame 160, 181, to the inside of the liquid crystal display panel can be prevented. Furthermore, deterioration of the display quality can be prevented.

Since the alignment film 128, 143 can be formed so that the halo region is located outside the display region R1, the aforementioned problem (6) can be solved. This is because due to the frame 160, 181 the area of the halo region of the alignment film 128, 143 can be reduced. Thus, lowering of the display quality caused by the effect of the halo region of the alignment film 128, 143 can be prevented.

As described above, the aforementioned problems (4) and (5), which could not be solved at the same time, can be solved. That is, since the viscosity of the alignment film application liquid 128a can be made lower, the alignment film application liquid 128a can easily spread well, so that formation of the alignment film 128 having a uniform thickness can be made easier. Moreover, by providing the frame 160, it is possible to easily ensure the linearity of the peripheral edge of the alignment film 128.

Furthermore, from the above, the alignment film 128, 143 can be formed by ink jet application. That is, a method that is excellent in productivity can be employed.

As described above, according to this embodiment, a technique can be provided that can achieve both improvement of edge rectilinearity of an alignment film and reduction of unevenness. Moreover, it is possible to provide a liquid crystal display device which has a high image quality even if a bezel thereof is narrow. Furthermore, a manufacturing method of a liquid crystal display device can be provided that realizes a high yield even if a bezel is narrow. In addition, entrance of moisture to the inside of a liquid crystal display panel can be further reduced by forming a slit in a protective insulation film and covering it with a seal member.

Second Embodiment

Figure 12:
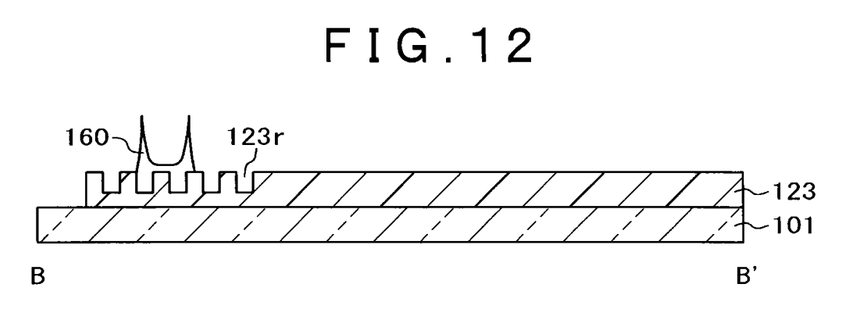
FIG. 12 is a schematic cross-sectional view taken along line B-B' in FIG. 9, for explaining an alignment film formation step (formation of a frame of an alignment film formation region) in a manufacturing method of a liquid crystal display device according to a second embodiment of the present invention.

A second embodiment of the present invention is described by using FIG. 12. The matter described in the first embodiment but not described in this and later embodiment can be also applied to this and later embodiments, unless there are specific circumstances. The difference between the first embodiment and this embodiment is in that the shape of the protective insulation film 123 on which the frame (bank portion) 160 is formed on the TFT substrate is different.

A TFT substrate 101 in a liquid crystal display device according to this embodiment has a groove (concave portion) 123r formed in the protective insulation film 123 over an entire region of an outer peripheral portion of an alignment film formation region as shown in FIG. 12. The groove 123r formed in the protective insulation film 123 is located in a bezel region R2 in which a frame 160 is to be formed. In this case the groove 123r formed in the protective insulation film 123 is continuously formed in a frame configuration (rectangular frame configuration) continuously without being disconnected. The width and pitch of the groove 123r are 20 μm, for example. Please note that the groove is not necessarily formed in the protective insulation film, but may be formed in another organic or inorganic film formed on the TFT substrate. A step in a wiring pattern may be also used.

The height h of the frame 160 is 1.7 μm, for example, and was formed so that the height from the top surface of the protective insulation film 123 was 0.3 μm to 1.0 μm. By forming the groove 123r in the protective insulation film 123, the height limitation of the frame 160 can be relieved while a gap (desired cell gap) is ensured or further ensured between a counter substrate 102 and the frame 160. Also, spreading of the frame 160 in a width direction can be further suppressed by the groove 123r (to about a half of that in a case where no groove is formed). The groove 123r is formed to linearly extend in each side of the bezel region R2. Therefore, it is possible to further ensure the linearity (rectilinearity) of the frame 160 in each side of the bezel region R2, as compared with the first embodiment.

As described above, by forming the frame 160 on the groove 123r, the frame 160 can be formed higher and a desired volume of the frame 160 can be ensured. The frame 160 having a desired volume enables spreading of an alignment film 128 toward the peripheral edge of the TFT substrate 101 to be suppressed, so that the alignment film 128 can be formed while the peripheral edge of the alignment film 128 is prevented from reaching the outside of the alignment film formation region. Moreover, because of the linearity of the frame 160, it is possible to suppress formation of the zigzag shape of the peripheral edge of the alignment film 128, that is, to ensure the linearity of the peripheral edge of the alignment film 128. In addition, ink for forming the frame spreads in a longitudinal direction along the groove to a degree corresponding to the reduction in the width of the frame. Therefore, the dropping pitch of the ink for forming the frame can be made larger and the ink usage can be reduced.

A desired volume of the frame 160 can be ensured without increasing the width of the frame 160. As described above, because the linearity of the peripheral edge of the alignment film 128 can be ensured and the width of the frame 160 does not have to be increased, it is possible to contribute to making the bezel narrower.

A counter substrate 102 may have a groove formed over the entire region of an outer peripheral portion of a region in which an alignment film is to be formed on a glass substrate 141. For example, in a case where the counter pattern 102p has an overcoat layer, the groove may be formed in the bezel region R2 in the overcoat layer. Thus, a frame 181 can be formed over the groove in the overcoat layer.

By forming the groove also on the counter substrate 102 side, the height limitation of the frame 181 can be relieved while the gap (desired cell gap) is ensured or further ensured between the TFT substrate 101 and the frame 181. Also, spreading of the frame 181 in the width direction can be suppressed.

Moreover, it is possible to form the frame 181 having a desired volume, suppress spreading of the alignment film 143 toward the peripheral edge of the counter substrate 102, and form the alignment film 143 so that the peripheral edge of the alignment film 143 does not reach the outside of the alignment film formation region. Furthermore, the linearity of the frame 181 can be further improved. The width of the frame 181 can be also reduced. Thus, it is possible to further contribute to realize a narrow bezel.

The width of the groove 123r formed in the protective insulation film, the height and width of the frame 160, and the height and width of the frame 181 are not limited to the aforementioned values, but can be changed in various ways. It is enough that the groove 123r and the frames 160 and 181 are formed so that those can dam the alignment film application liquid 128a dropped onto the TFT substrate and the alignment film application liquid dropped onto the CF substrate.

When a liquid crystal display device was manufactured by using the TFT substrate having the structure shown in FIG. 12 and forming the frames and the alignment films in the procedure shown in FIGS. 9 to 11C, the liquid crystal display device could be manufactured with a high yield even if it had a narrow bezel. In addition, when this liquid crystal display device was evaluated, burn-in and unevenness were reduced even if it had a narrow bezel and a high quality image was obtained.

As described above, according to this embodiment, the same effects as those in the first embodiment can be obtained. Moreover, by forming the frame over the groove, it is possible to further narrow the bezel.

Third Embodiment

Figure 14:
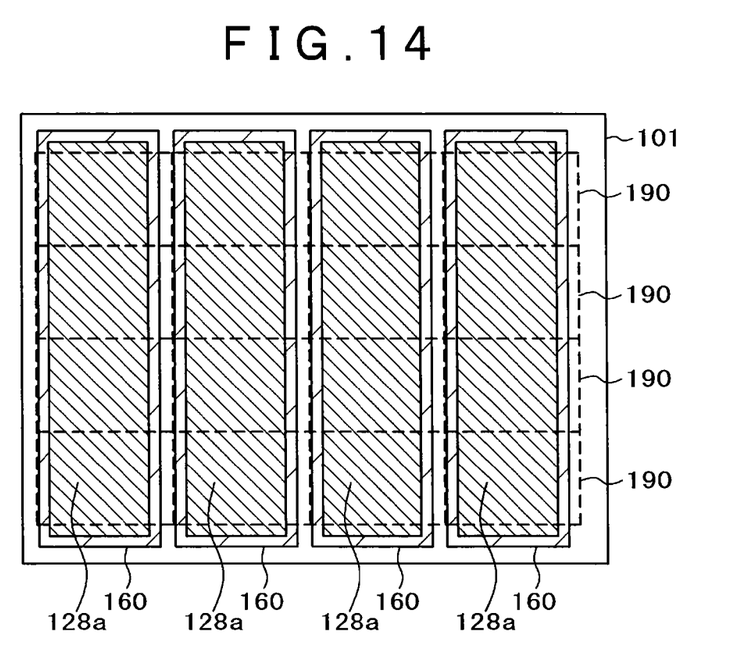
FIG. 14 is a schematic plan view for explaining an alignment film formation step (application of an application liquid for forming an alignment film in an alignment film formation region) in a manufacturing method of a liquid crystal display device according to a third embodiment of the present invention.

A third embodiment of the present invention is described by using FIG. 14. The difference between the first embodiment and this embodiment is in that the shape of the frame (bank portion) 160 on the TFT substrate 101 containing a plurality of liquid crystal display panel regions 190 (4×4 regions sectioned with broken line) is different.

In the above embodiments, the structures are described which can handle the problem that, in a case where the alignment film is formed also in the outside of the region in which the seal member is to be formed, the adhesion force between the substrates is lowered and moisture may enter to the inside of the liquid crystal display panel via the alignment film. More specifically, the structures are disclosed in which the frame is provided on the display region R1 side of the seal region in which the seal member is provided and spreading of the alignment film application liquid is prevented by that frame. However, the adhesion strength between the alignment film and the seal member and entrance of moisture may be improved by improving the material for the seal member and/or the material for the alignment film. Even in that case, however, it is impossible to apply the alignment film application liquid on the entire surface of the TFT substrate without forming the frame 160 in FIG. 10. This is because, when the alignment film is formed also in the driving circuit portion 210 shown in FIG. 13, terminals formed on the TFT substrate are also covered by the alignment film and therefore connection between the terminal and the semiconductor chip and connection between the terminal and an external circuit (e.g., a circuit on a system side of a portable electronic device) cannot be achieved. Even in a case where the driving circuit is built on the TFT substrate in place of the semiconductor chip, connection to the external circuit is necessary. In that case, it is also necessary to form the frame to provide a region in which no alignment film is formed. This is the same for the other embodiments. Moreover, in some cases, the peripheral portion of the TFT substrate on which a plurality of liquid crystal display panel regions are formed and the peripheral portion of the counter substrate are sealed with a seal member (that is different from sealing for liquid crystal) and then the glass substrates are subjected to polishing for reducing the thickness of the liquid crystal display panel. In those cases, it is necessary to arrange the outer peripheral portion of the alignment film formation region inside the seal provided in the peripheral portion of the substrate for immersing the substrate in a polishing liquid. In FIG. 14, all the display regions of four liquid crystal display panel regions arranged side by side in the vertical direction of the TFT substrate are surrounded by a single frame 160, and driving circuit portions for the respective liquid crystal display panels are arranged outside the frame. Thus, the alignment film is formed in the display region, whereas no alignment film is formed in the driving circuit portion. In each liquid crystal display panel formed in this embodiment, the alignment film is not formed in the driving circuit portion and the frame is formed between the display region and the driving circuit portion. The frame is not formed along other sides than the side in which the driving circuit portion is provided, and the alignment film and the seal member are overlapped there.

When a liquid crystal display device was manufactured by forming the frame and the alignment film in the configuration shown in FIG. 14, the liquid crystal display device could be manufactured with a high yield even if it had a narrow bezel. In addition, when this liquid crystal display device was evaluated, burn-in and unevenness were reduced even if it had a narrow bezel and a high quality image could be obtained.

As described above, according to this embodiment, the same effects as those in the first embodiment can be obtained.

Fourth Embodiment

Figure 15:
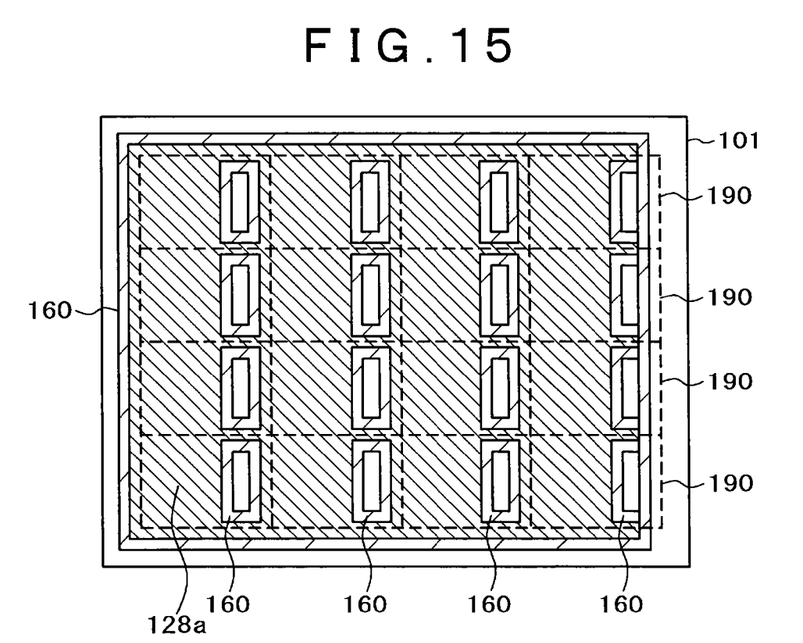
FIG. 15 is a schematic plan view for explaining an alignment film formation step (application of an application liquid for forming an alignment film in an alignment film formation region) in a manufacturing method of a liquid crystal display device according to a fourth embodiment of the present invention.

A fourth embodiment of the present invention is described by using FIG. 15. The difference between the third embodiment and this embodiment is in that, in the TFT substrate 101 having a plurality of liquid crystal display panel regions 190 (4×4 regions sectioned with broken line), the liquid crystal display panels are surrounded by the frame (bank portion) 160 and the driving circuit portion of each of the liquid crystal display panel region is also surrounded by the frame. In FIG. 15, in each of the liquid crystal display panels formed in this embodiment, no alignment film is formed in the driving circuit portion and the frame is formed to surround the driving circuit portion. Please note that a terminal for connection with an external circuit is provided in the side of the TFT substrate on the driving circuit portion side. Therefore, a portion around the terminal is also surrounded by the frame and has no alignment film therein. The frame is not formed in other sides than the side in which the driving circuit portion is provided, and the alignment film and the seal member are overlapped there. In a situation where the strength and waterproofness are improved by a material approach for the seal member or the alignment film, the problem of the present application can be solved even by the structures in Embodiments 3 and 4. Moreover, while a demand for reducing the area of the driving circuit portion as small as possible is high, the area of the driving circuit portion can be finely controlled by putting the invention in the present application into practice.

When a liquid crystal display device was manufactured by forming the frame and the alignment film in the configuration shown in FIG. 15, the liquid crystal display device could be obtained with a high yield even if it had a narrow bezel. In addition, when evaluation of this liquid crystal display device was performed, burn-in and unevenness could be reduced even if this liquid crystal display device had a narrow bezel and a high quality image could be obtained.

As described above, according to this embodiment, the same effects as those of the first embodiment can be obtained.

Although some embodiments of the present invention are described, these embodiments are described as examples but are not intended to limit the scope of the invention. The invention in the present application is to, prior to formation of an alignment film, form a bank by a highly water repellent organic material having a low solubility in an application liquid for forming the alignment film. Novel embodiments derived from this idea can be put into practice in various other forms, and various omissions, replacements, and modifications can be made without departing from the summary of the invention. These embodiments and variations thereof are included in the scope and summary of the invention and are also included in the scope of the claimed invention and equivalents thereof.

Within the spirit of the present invention, a person skilled in the art could conceive various changes and modifications, and those changes and modifications can be deemed as belonging to the scope of the present invention. For example, what is obtained by addition, deletion, or design change of a component or addition, omission or condition change of a process to the aforementioned respective embodiments carried out by a person skilled in the art as appropriate is also included in the scope of the present invention, as long as it has the summary of the present invention.

Moreover, among other operations and effects derived from the forms described in these embodiments, what is apparent from the description of this specification or could be conceived as appropriate by a person skilled in the art is deemed as being able to be naturally obtained by the present invention.

What is claimed is:

1. A liquid crystal display device comprising:
a first substrate on which a thin film transistor and a first alignment film are formed;
a second substrate, opposed to the first substrate, on which a second alignment film is formed; and
a liquid crystal layer sandwiched between the first substrate and the second substrate, wherein
the first substrate and the second substrate are bonded to each other with a seal member,
a frame is arranged inside the seal member around the first alignment film to surround the first alignment film, and
a material forming the frame is a highly water repellent organic material having low solubility in an application liquid for forming the first alignment film.

2. The liquid crystal display device according to claim 1, wherein the application liquid for forming the first alignment film is a GBL (γ-butyrolactone) rich liquid.

3. The liquid crystal display device according to claim 1, wherein, a width of the frame is a value in a range from 50 µm to 300 µm.

4. The liquid crystal display device according to claim 1, wherein a height of the frame is a value in a range from 0.3 µm to 1.0 µm.

5. The liquid crystal display device according to claim 1, wherein the frame is formed on an organic insulation film arranged on the first substrate.

6. The liquid crystal display device according to claim 5, wherein the frame is formed on a groove provided in a frame configuration in the organic insulation film.

7. The liquid crystal display device according to claim 5, wherein the organic insulation film has a slit filled with the seal member.

8. The liquid crystal display device according to claim 1, wherein a surface region of the first substrate on which the first alignment film is formed is more uneven than a surface region of the second substrate on which the second alignment film is formed.

9. A liquid crystal display device comprising:
a first substrate having a display region on which a first alignment film is formed;
a second substrate, opposed to the first substrate, on which a second alignment film is formed; and
a liquid crystal layer sandwiched between the first substrate and the second substrate, wherein
the first substrate and the second substrate are bonded to each other with a seal member,
a driving circuit portion is provided on the first substrate, and a frame is arranged between the driving circuit portion and the display region,
the first alignment film is arranged to extend from the frame to the display region, and
a material for forming the frame is a highly water repellent organic material having low solubility in an application liquid for forming the first alignment film.

10. The liquid crystal display device according to claim 9, wherein a width of the frame is a value in a range from 50 µm to 300 µm.

11. The liquid crystal display device according to claim 9, wherein a height of the frame is a value in a range from 0.3 µm to 1.0 µm.

12. The liquid crystal display device according to claim 9, wherein the frame is formed on an organic insulation film arranged on the first substrate.

13. A manufacturing method of a liquid crystal display device comprising:
a first step of preparing a first substrate on which thin film transistors are formed;
a second step of forming a frame on the first substrate by ink jet application;
a third step of applying an application liquid for forming a first alignment film on one of two regions sectioned by the frame by ink jet application;
a fourth step of forming the first alignment film;
a fifth step of preparing a second substrate on which a second alignment film is formed; and
a sixth step of arranging a liquid crystal layer between the first substrate and the second substrate that are arranged such that the first alignment film and the second alignment film are opposed to each other, in a region surrounded by a seal member,
wherein a material forming the frame is a highly water repellent organic material having a low solubility in the application liquid for forming the first alignment film.

14. The manufacturing method of the liquid crystal display device according to claim 13, wherein the first substrate is heated when the frame is formed in the second step.

15. The manufacturing method of the liquid crystal display device according to claim 13, wherein the first alignment film is formed by irradiating the applied application liquid with light.

16. The manufacturing method of the liquid crystal display device according to claim 13, wherein the second step includes a step of applying an application liquid for forming the frame and a step of drying it, while the first substrate is heated.

17. The manufacturing method of the liquid crystal display device according to claim 13, wherein a temperature of the first substrate in the third step is lower than a temperature of the first substrate in the fourth step.

18. The manufacturing method of the liquid crystal display device according to claim 13, wherein a temperature of the first substrate in the fourth step is lower than a temperature of the first substrate in the second step.

19. The manufacturing method of the liquid crystal display device according to claim 13, wherein the application liquid for forming the first alignment film in the third step has a lower viscosity than an application liquid for forming the second alignment film.

* * * * *